United States Patent
Li et al.

(10) Patent No.: US 6,794,293 B2
(45) Date of Patent: Sep. 21, 2004

(54) TRENCH ETCH PROCESS FOR LOW-K DIELECTRICS

(75) Inventors: SiYi Li, Milpitas, CA (US); S. M. Reza Sadjadi, Saratoga, CA (US); David R. Pirkle, Soquel, CA (US); Steve Lassig, Plesanton, CA (US); Sean Kang, Fremont, CA (US); Vinay Pohray, Fremont, CA (US); Peter Cirigliano, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 34 days.

(21) Appl. No.: 09/972,765

(22) Filed: Oct. 5, 2001

(65) Prior Publication Data

US 2004/0038540 A1 Feb. 26, 2004

(51) Int. Cl.$^7$ ............................................. H01L 21/302

(52) U.S. Cl. ...................................... 438/700; 438/723

(58) Field of Search ................................ 438/694, 700, 438/702, 706, 714, 723, 725

(56) References Cited

U.S. PATENT DOCUMENTS

| | | | | |
|---|---|---|---|---|
| 6,004,883 A | * | 12/1999 | Yu et al. | 438/706 |
| 6,204,166 B1 | * | 3/2001 | McTeer | 438/624 |
| 6,372,635 B1 | * | 4/2002 | Wang et al. | 438/638 |
| 6,376,366 B1 | * | 4/2002 | Lin et al. | 438/637 |
| 6,380,073 B1 | * | 4/2002 | Hwang et al. | 438/637 |
| 6,429,116 B1 | * | 8/2002 | Wang et al. | 438/623 |
| 6,514,860 B1 | * | 2/2003 | Okada et al. | 438/687 |

* cited by examiner

*Primary Examiner*—Kin-Chan Chen
(74) *Attorney, Agent, or Firm*—IP Strategy Group, P.C.

(57) ABSTRACT

The present inventions is a method of trench formation within a dielectric layer, comprising, first, etching a via within the dielectric layer. After the via is etched, an organic plug is used to fill a portion of the via. After the desired amount of organic plug has been etched from the via, a trench is etched with a first gas mixture to a first depth, and a second gas mixture is used to further etch the trench to the final desired trench depth. Preferably, the method is used for low-k dielectrics that do not have an intermediate etch stop layer. Additionally, it is preferable that the first gas mixture is a polymeric gas mixture and the second gas mixture is a non-polymeric gas mixture. As a result of using this method, an interconnect structure for a low-k dielectric without an intermediate etch stop layer having a trench with trench edges that are substantially orthogonal and a via with via edges that are substantially orthogonal is generated.

19 Claims, 7 Drawing Sheets

FIG. 1A  FIG. 1B  FIG. 1C  FIG. 1D  FIG. 1E  FIG. 1F

*PRIOR ART*

TRENCH ETCH PROCESS FOR LOW-K DIELECTRICS

BACKGROUND OF THE INVENTION

1. Field of Invention

The present invention relates to the etching of dielectric materials. More particularly, the present invention is related to the etching of dielectric materials used as interconnect dielectrics in semiconductor fabrication.

2. Description of Related Art

In semiconductor integrated circuit (IC) fabrication, devices such as component transistors are formed on a semiconductor wafer substrate that is typically made of silicon. During the fabrication process, various materials are deposited on the different layers in order to build a desired IC. Typically, conductive layers may include patterned metallization lines, polysilicon transistor gates and the like, are insulated from one another with dielectric materials. The dielectric materials have typically been formed from silicon dioxide, $SiO_2$, to insulate conductive lines on various layers of a semiconductor structure. As semiconductor circuits become faster and more compact, operating frequencies increase and the distances between the conductive lines within the semiconductor device decrease. This introduces an increased level of coupling capacitance to the circuit, which has the drawback of slowing the operation of the semiconductor device. Therefore, it has become important to use dielectric layers that are capable of effectively insulating conductive lines against such increasing coupling capacitances.

In general, the coupling capacitance in an integrated circuit is directly proportion to the dielectric constant, k, of the material used to form the dielectric layers. As noted above, the dielectric layers in conventional integrated circuits have traditionally been formed of $SiO_2$, which has a dielectric constant of about 4.0. As a consequence of the increasing line densities and operating frequencies in semiconductor devices, dielectric layers formed of $SiO_2$ may not effectively insulate the conductive lines to the extent required to avoid increased coupling capacitance levels.

As a result a substantial degree of research is being conducted into the use of low-k dielectric materials. Low-k dielectrics can be categorized as follows: doped oxide, organic, highly fluorinated, and porous materials. Low-k materials can be deposited either by spin-on or CVD methods. Porous materials typically use spin-on methods, with controlled evaporation of the solvent providing the desired pore structure. A table of typical low-k dielectrics is provided below.

| Illustrative Classification of Low-k Materials | | | |
|---|---|---|---|
| Film Types | Sub-Type | Examples | k range |
| Doped Oxide | F-doped | FSG | 3.5 |
| | H-doped | HSQ | 2.7–3.5 |
| | C (and H) doped | OSG, MSQ, CVD low-k | 2.6–2.8 |
| Organic | | BCB, SiLK, FLARE, PAE-2 | 2.6–2.8 |
| Highly Fluorinated | | Parylene AF4, a-CF, PTFE | 2.0–2.5 |
| Porous | | Aerogels, Xerogels, Nanogels | <2.2 |

One of the well-known implementation strategies for incorporating low-k materials into IC fabrication includes the use of a copper dual damascene process. A dual damascene structure employs an etching process that creates trenches for lines and holes for vias which are then simultaneously metallized to form the interconnect wiring. The two well known dual damascene schemes are referred to as a via first sequence and a trench first sequence.

One well known illustrative via first sequence requires that a via is masked and a trench dielectric, a via dieletric and an intermediate etch-stop layer are etched and the etching stops at a barrier layer such as silicon nitride. The wafer is then re-patterned for the subsequent trench and this pattern etched, stopping on the intermediate etch-stop layer. In some cases, the via is covered by a photoresists or organic ARC plug that protects the via and the underlying barrier nitride during the trench etch process. The trench first sequence is similar to the via first sequence only the trench is etch before the via is etched.

One of the limitations of the prior art dielectric structures is that these structures contain an intermediate etch stop layer. The intermediate etch stop layer creates two substantial problems. The first problem is the intermediate etch stop layer generally has a high dielectric constant and contributes to capacitive coupling within the structure. Additionally, the intermediate etch stop layer adds another process layer to formation of dielectric wafer.

Therefore, it would be beneficial to develop a method for etching low-k dielectric materials without the use of an intermediate etch-stop layer.

It would also be beneficial to provide a method that simplifies the manufacturing of low-k dielectric wafers by not requiring an intermediate etch-stop layer.

However, the removal of the intermediate etch-stop layer in a low-k dielectric creates additional challenges that the prior art has not overcome. These challenges include controlling critical dimensions (CD) by controlling via depth and trench depth and creating structures that are smooth and flat.

Therefore it would be beneficial to provide a method for processing low-k dielectric materials that is capable of maintaining CD control.

It would also be beneficial to provide a method for processing low-k dielectric materials to achieve controlled trench and via depth.

SUMMARY OF INVENTION

The present inventions is a method of trench formation within a dielectric layer, comprising, first, etching a via within the dielectric layer. After the via is etched, an organic plug is used to fill a portion of the via. After the desired amount of organic plug has been etched, a trench is etched with a first gas mixture to a desired depth, and a second gas mixture is used to further etch trench to the final desired trench depth. Preferably, the first gas mixture is a polymeric gas mixture and the second gas mixture is a non-polymeric gas mixture. Preferably, the method is applied to a low-k dielectric without an intermediate etch stop layer.

As a result of using this method, an interconnect structure having a trench with trench edges that are substantially orthogonal and a via with via edges that are substantially orthogonal is generated. Preferably, the interconnect structure is a low-k dielectric structure without an intermediate etch stop layer.

BRIEF DESCRIPTION OF THE DRAWINGS

Preferred embodiments of the present invention are shown in the accompanying drawings wherein.

DETAILED DESCRIPTION

In the following detailed description, reference is made to the accompanying drawings, which form a part of this application. The drawings show, by way of illustration, specific embodiments in which the invention may be practiced. It is to be understood that other embodiments may be utilized and structural changes may be made without departing from the scope of the present invention.

Figure 1A:
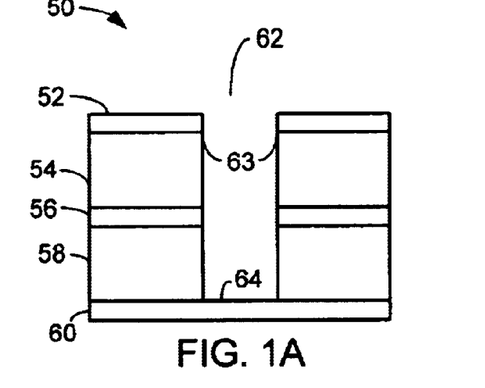
FIG. 1A through FIG. 1F is a prior art via first etch sequence for a dielectric having an intermediate etch stop layer.

Referring to FIG. 1A through FIG. 1F there is shown a prior art via first trench etch sequence for a dielectric having an intermediate etch stop layer. FIG. 1A shows an illustrative wafer stack 50 that includes a hardmask layer 52, a first dielectric layer 54, an intermediate etch-stop layer 56, a second dielectric layer 58 and a barrier layer 60. A via 62 has already been etched into the wafer stack 50 and its corresponding photoresist (not shown) has been removed. The via 62 is defined by two sidewalls 63 and a bottom 64. The material properties for the hardmask layer, low-k dielectric layer, intermediate etch-stop layer, and barrier layer determine the type of etching processes used.

An illustrative hardmask layer 52 of $SiO_2$ or $Si_3N_4$ is used. An illustrative dielectric material in dielectric layer 54 and 56 is an organosilicate (OSG) dielectric such as CORAL™ from Novellus of San Jose, Calif. An illustrative trench etch-stop layer 56 is SiC or $Si_3N_4$. An illustrative barrier layer 60 is a SiC layer. It shall be appreciated by those skilled in the art that the barrier layer 60 separates the second dielectric 58 from the wafer structure beneath the wafer stack 50.

Figure 1B:
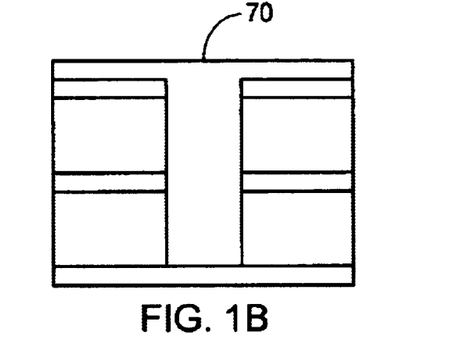
Figure 1C:
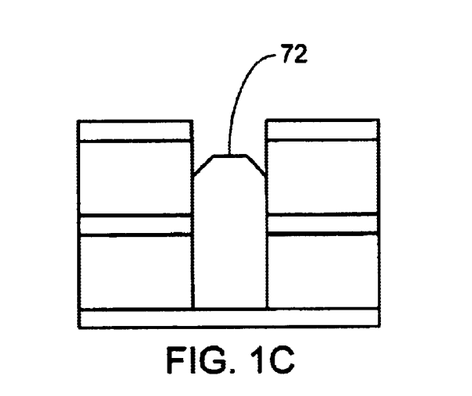

During the via first etch sequence an organic layer 70 is applied using a well-known planarized organic spin-on technique. The resulting organic layer 70 is shown in FIG. 1B. The organic layer is then etched back using gas mixture that includes either $H_2$, $O_2$, or $N_2$ or any combination thereof. As a result of the organic layer 70 being etched back an organic plug 72 is formed as shown in FIG. 1C.

Figure 1D:
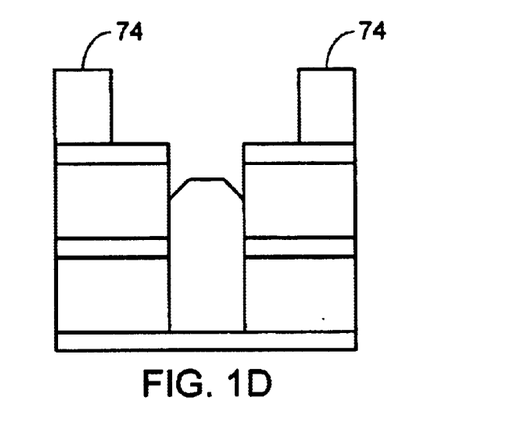
Figure 1E:
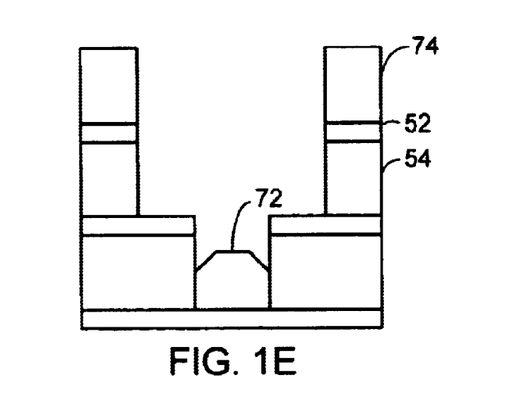
Figure 1F:
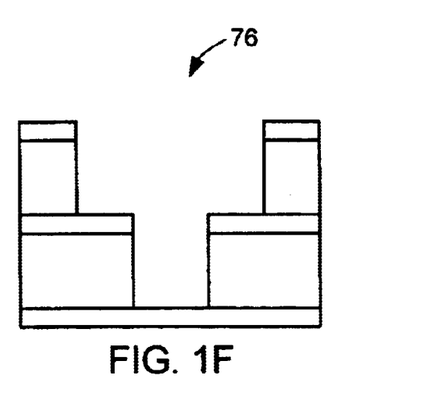

To generate the desired trench a photoresist layer 74 is applied as shown in FIG. 1D. Then, a trench etch process is performed and results in the removal of a portion of the dielectric material 54 and hardmask 52 as shown in FIG. 1E. A gas mixture is then used in the trench etch process to remove the hardmask 52 and the dielectric material 54. The intermediate etch-stop layer 56 prevents additional etching from the trench etch process. The photoresist layer 74 and the plug 72 is then removed as shown in FIG. 1F, thereby providing the desired dual damascene structure 76 with a trench etch.

Based on the discussion of this prior art via first trench etch process it is clear that the intermediate etch-stop layer serves a dual purpose of protecting the underlying dielectric material 58 and provides a boundary that defines the depth of the trench. However, the use of an intermediate etch-stop layer adds additional processing steps and a capacitive component to the wafer 50.

Figure 2:
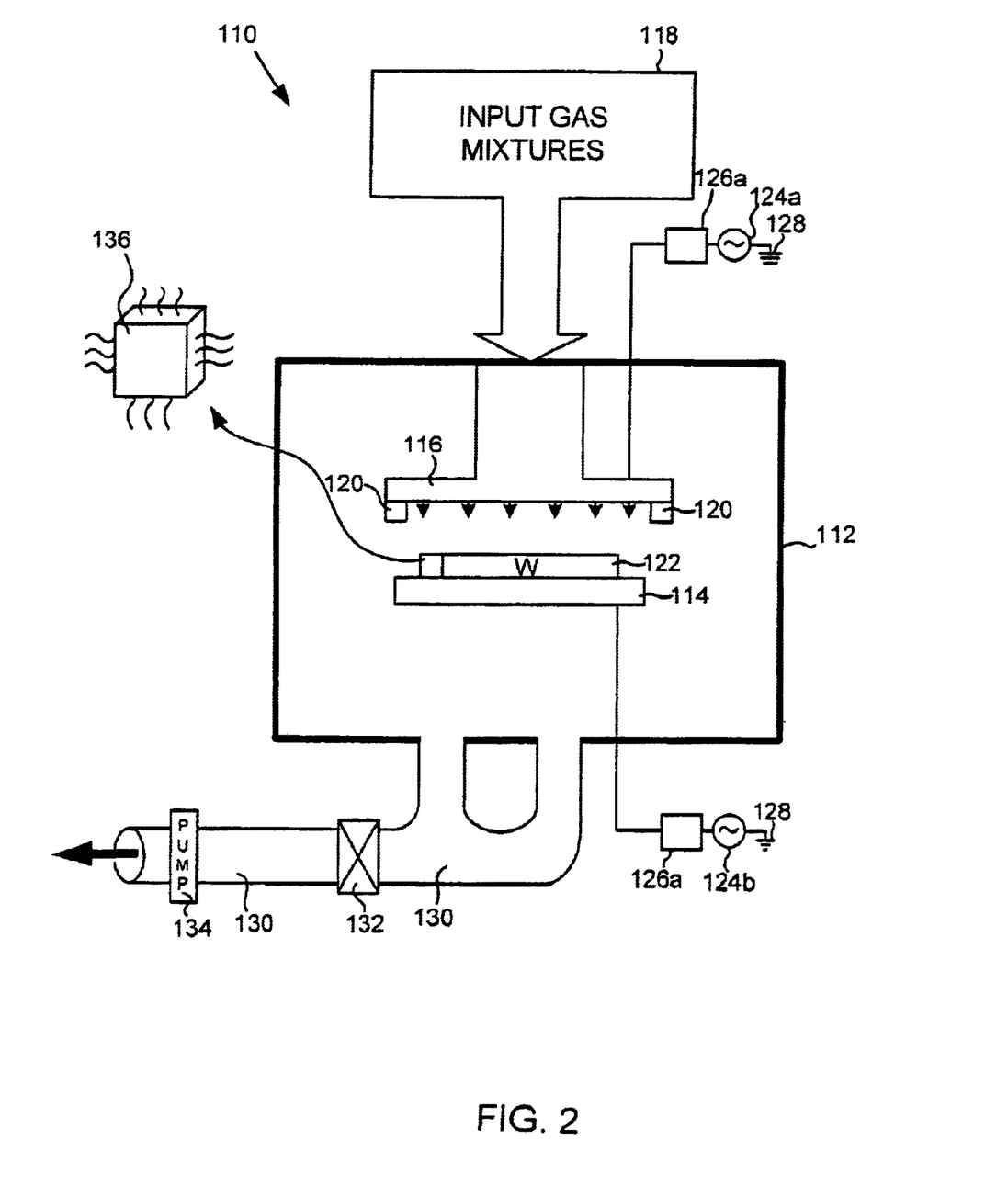
FIG. 2 is an illustrative etching system.

FIG. 2 is an illustrative plasma etching system 110 that includes a process chamber 112 used to deposit and etch materials on the wafer stack 50 of FIG. 1. The process chamber 112 generally includes a bottom electrode 114 and a top electrode 116 that also acts as a shower head for allowing input gas mixtures 118 to enter the process chamber 112 at a location that is between the bottom electrode 114 and the top electrode 116. Generally, the top electrode 116 includes a quartz confinement ring 120 that encircles an edge that is under the top electrode 116. In this manner, the quartz confinement ring 120 is directly above a wafer 122 that is placed on top of the bottom electrode 114.

The process chamber 112 establishes a dual frequency parallel plate processing arrangement where a first radio frequency (RF) source 124a is coupled to the top electrode 116 through a RF matching network 126a. In a like manner, the bottom electrode 112 is coupled to a second RF source 124b through a second RF matching network 126b. Further, each of the RF sources 124a and 124b are coupled to ground 128.

In operation, the process chamber 112 may exhaust processing gasses through a high conductance pumping network 130 that leads to a VAT valve 132. The VAT valve 132 is then coupled to a drag pump 134 that assists in channeling the process gas to a suitable storage unit (not shown). In one embodiment, the wafer 122 is subjected to a multitude of processing operations, including the high selectivity etching performed in the process chamber 112, that enables the fabrication of a plurality of semiconductor dies. The semiconductor dies are in turn packages to produce a plurality of packaged integrated circuit chips 136. In one embodiment, the process chamber 12 may be a Lam Research Rainbow or Exelan processing chamber, which is available from Lam Research Corporation of Fremont, Calif. Of course, other suitably arranged processing chambers may be used to achieve the highly selective etching operation of the present invention.

By way of example, the invention may be practiced in a number of other suitably arranged processing chambers that deliver energy to the plasma through a capacitively coupled parallel electrode plates, through electron cyclotron resonance (ECR) microwave plasma sources, through inductively coupled RF sources such as helicon, helical resonantors, and transformer coupled plasma (TCP), among others, are also available from Lam Research of Fremont, Calif. Other examples of suitable processing chambers include an inductive plasma source (IPS), a decoupled plasma source (DPS), and a dipole ring magnet (DRM).

As previously described in the description of the related art, there are unique problems associated with the etching of low-k dielectric that do not have an intermediate etch-stop layer. More particularly the problems are related to the etching trenches within a low-k dielectric without an intermediate etch-stop layer. The inventors of this patent have discovered that trenches having fences or facets are generated using well known etching methods. The inventors of the present patent have also discovered that the degree of fencing or facetting is a function of the gas mixtures used and the height of an organic plug resident within a via. A more detailed description of a method for generating a fence or facet around a via during the trench etch process is described in FIG. 3A through FIG. 3F and in FIGS. 4A through 4F, respectively.

Figure 3A:
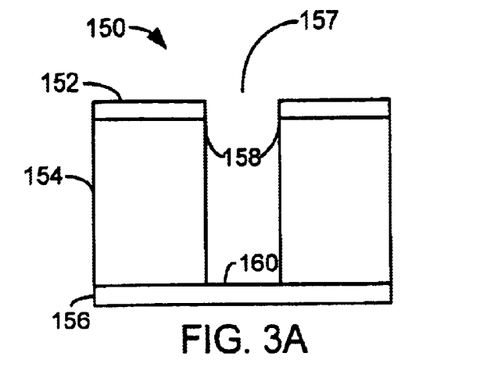
FIG. 3A through FIG. 3F is a trench etch sequence using a tall plug for a dielectric without an intermediate etch stop layer that generates a fence.

Referring to FIG. 3A through FIG. 3F there is shown a via first etch sequence with a tall plug that generates a fence around the via for a dielectric without an intermediate etch stop layer. FIG. 3A is an illustrative wafer stack 150 that includes a hardmask layer 152, a dielectric layer 154, and a barrier layer 156. As shown, a via 157 has already been etched into the wafer stack 150. The via 157 is defined by two sidewalls 158 and a bottom 160. An illustrative description of the material properties for each of the layers in the wafer stack 150 is provided in the discussion of FIG. 1A through FIG. 1F.

Figure 3B:
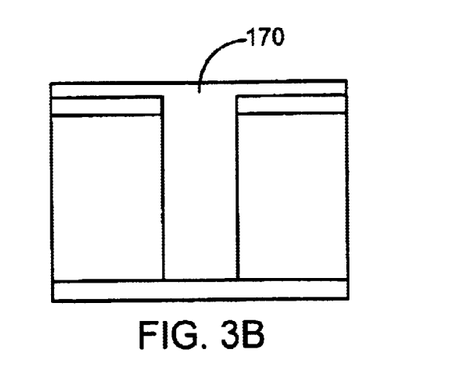
Figure 3C:
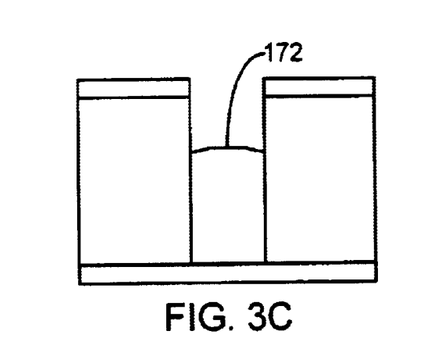
Figure 3D:
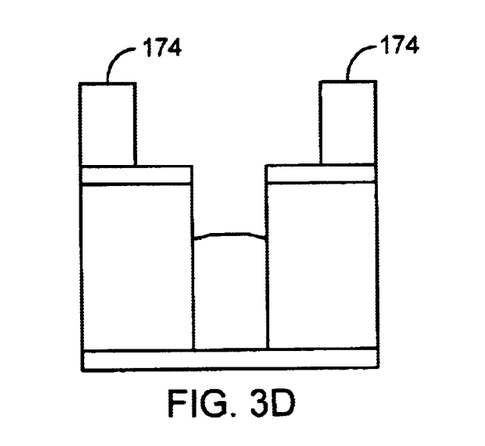

Referring to FIG. 3B, there is shown the application of an organic layer 170 using the well-known planarized organic spin-on technique. The organic layer is then etched back to form an organic plug 172 as shown in FIG. 3C. The organic plug 172 is relatively a "tall" plug having a height that is either equal to the desired trench height, or exceeds the desired trench height. A photoresist layer 174 is applied as shown in FIG. 3D. Then, a trench etch process is performed.

Figure 3E:
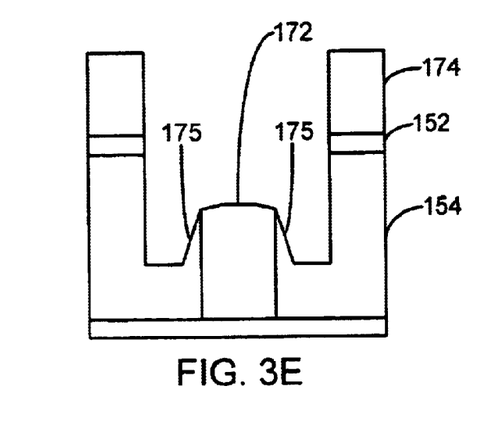
Figure 3F:
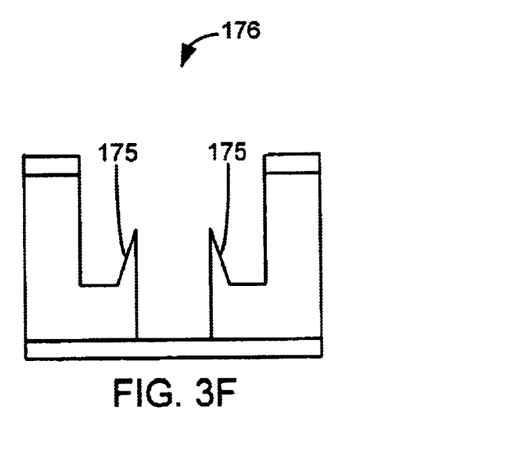

FIG. 3E shows the resulting fence 175 that is generated from the trench etch process with a tall plug. The trench etch process removes a portion of the dielectric material 154 and the hardmask 152. Since there is no intermediate etch-stop layer, the trench etch process produces the fence 175 surrounding the perimeter of the plug 172. The photoresist layer 174 and the plug 172 is then removed as shown in FIG. 3F. The resulting dual damascene structure having fence 175 is an unacceptable structure.

Figure 4A:
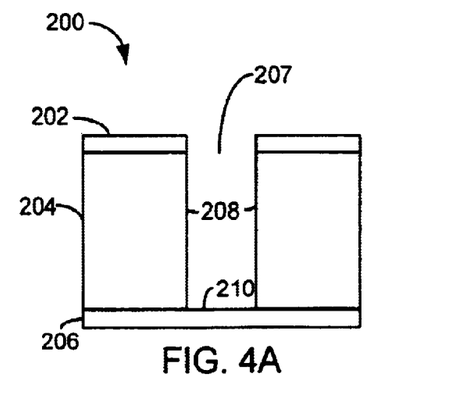
FIG. 4A through FIG. 4F is a trench etch sequence using a short plug for a dielectric without an intermediate etch stop layer that generates a facet.

FIG. 4A through FIG. 4F show the results of performing a trench etch sequence using a "short" plug that generates a facet around the via. Again the dielectric is a low-k dielectric that does not have an intermediate etch stop layer. Referring to FIG. 4A there is shown an illustrative wafer stack 200 that includes a hardmask layer 202, a dielectric layer 204, and a barrier layer 206. A via 207 has already been etched into the wafer stack 200. The via 207 is defined by two sidewalls 208 and a bottom 210. An illustrative description for the various materials making up the wafer stack 200 is provided in FIG. 1A through FIG. 1F.

Figure 4B:
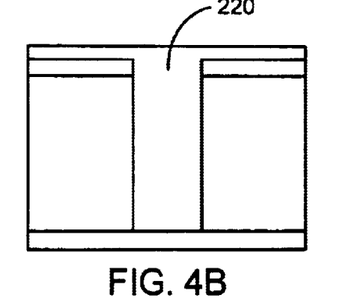
Figure 4C:
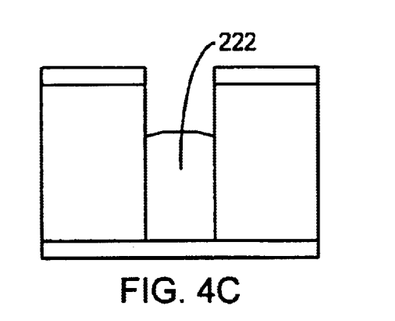
Figure 4D:
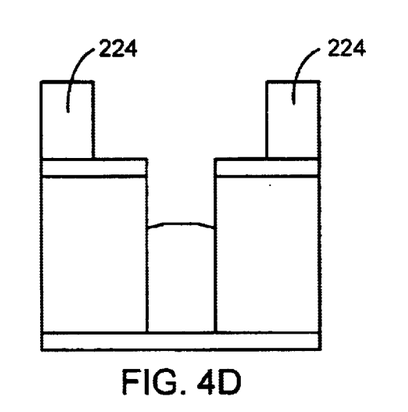

Referring to FIG. 4B, there is shown the application of an organic layer 220 using the well-known planarized organic spin-on technique. The resulting organic layer 220 is shown in FIG. 4B. The organic layer is then etched back to an organic plug 222 as shown in FIG. 4C. The organic plug 222 is a "short" plug having a height that is less than the desired trench height. A photoresist layer 224 is then applied as shown in FIG. 4D. Then, a trench etch process is performed.

Figure 4E:
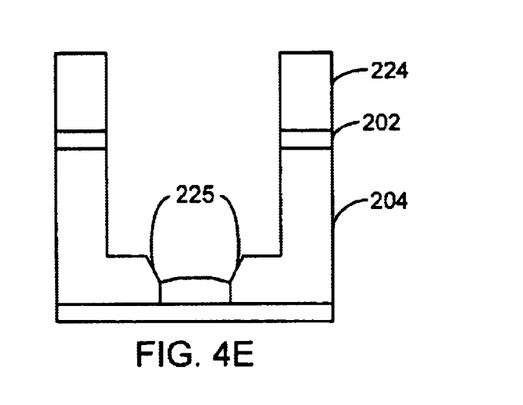
Figure 4F:
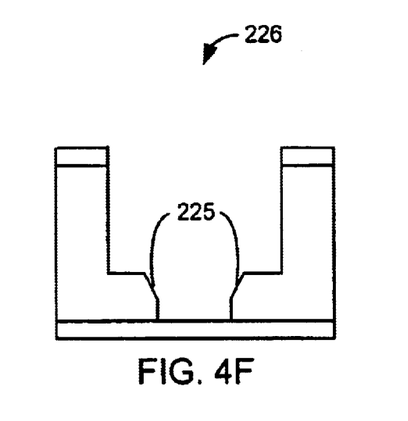
Figure 5:
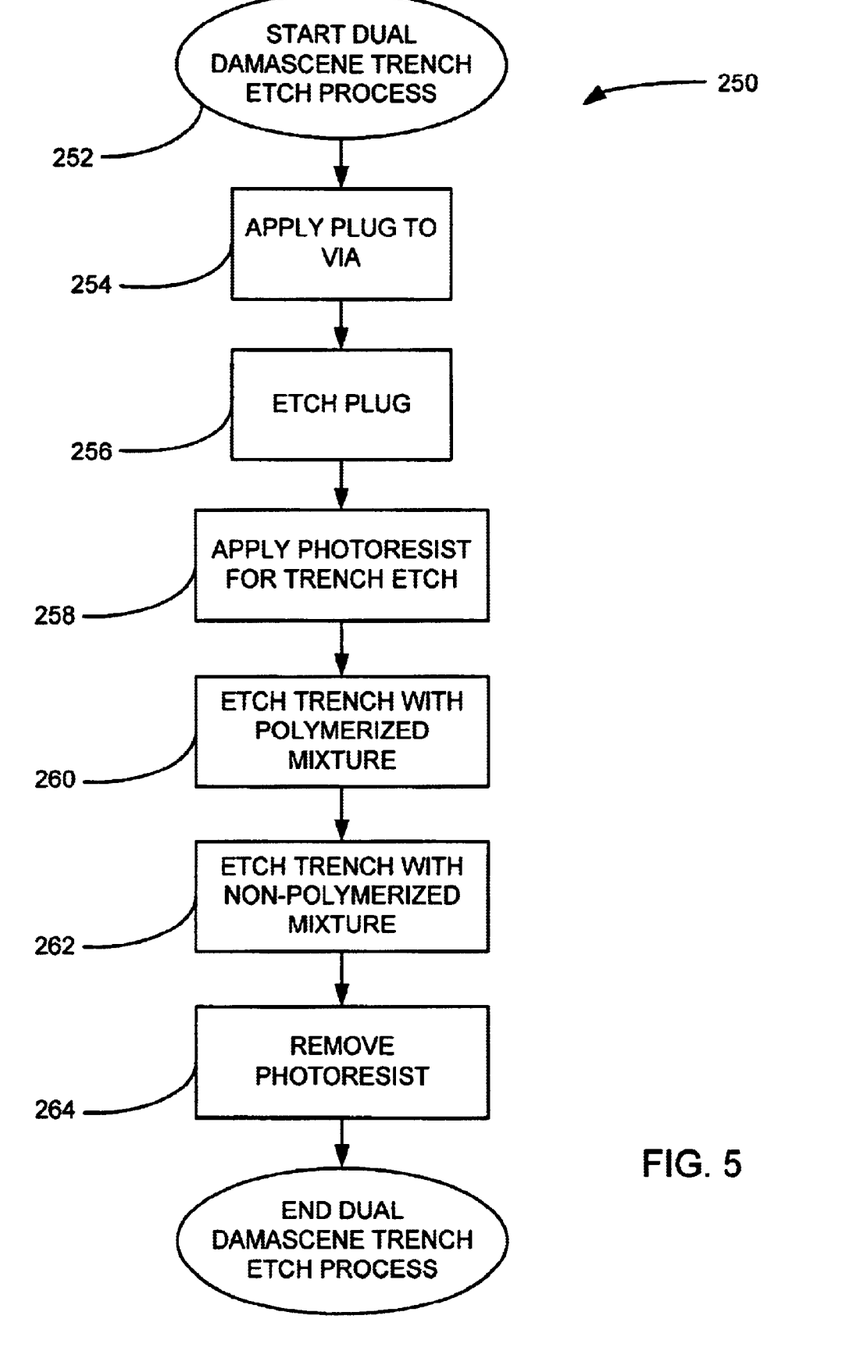
FIG. 5 shows a method for generating a trench etch without a fence or a facet.

FIG. 4E shows the resulting facet 225 that is generated from using trench etch process with a short plug. The trench etch processes removes a portion of the dielectric material 204 and hardmask 202. As a result of performing the trench etch without an intermediate etch-stop layer, the resulting trench etch has a facet 225 surrounding the perimeter of the plug 222. The photoresist layer 204 and the plug 222 is then removed as shown in FIG. 4F. Facetting is the result of etching and occurs where the sidewalls of a trench or via develop an ever-increasing facet or incline as the process of etching continues. The removal of the low-k dielectric material during the etching process typically starts at the corners of the trenches or vias that have been created and progressively continues form the corners down into the sidewalls of the trench. The resulting structure having facet 225 is an unacceptable structure. FIG. 5 shows a method 250 for generating a trench without a fence or a facet. Preferably, the method is applicable to low-k dielectrics that do not have an intermediate etch-stop layer. For purposes of this invention a low-k dielectric is defined as materials having k values of less than 3.0. The method generates an interconnect structure with trenches that are similar to the trenches shown in FIG. 6A and FIG. 6B. In an illustrative embodiment, the interconnect structure is a dual damascene structure that uses the plasma etching system 110 of FIG. 2.

The trench etch process 252 is initiated after a via is first etched into the dielectric and the photoresist used to pattern the via is removed. At process block 254 a layer of plug material is applied to the low-k dielectric. Typically, the plug material is an organic material that is applied using a spin-on technique. The method then proceeds to process block 256.

At block 256 the plug material is etched to the desired height using either $H_2$, $O_2$, $N_2$, or CO as the etchant gas. The desired height is determined is either greater than or equal to the desired trench height. More particularly, the plug height allows for fence formation, but does not permit faceting. Therefore, a "tall" plug is generated with the etchant as shown in FIG. 3C. The method then proceeds to process block 258. At block 258, a photoresist layer is applied to the low-k dielectric. The photoresist layer defines the trench location and the trench size during the trench etching process.

At process 260 the etch trench process is initiated with a first gas mixture. The first gas mixture is an etchant having a polymerized gas mixture. The polymerized gas mixture is specific to the removal of the photoresist. Additionally the polymerized gas is configured to generate a polymer film to protect the trench sidewalls. By way of example and not of limitation, the polymerized gas mixture includes: hydro-fluoro-carbon gases such as $CHF_3$ and $CH_2F_2$; or fluoro-carbon gases such as $C_4F_8$ and $CF_4$. The polymerized gas mixture deposits a polymer film. Preferably, during the anisotropic etch process the polymer film is cleared from the trench bottom and adheres to the sidewalls. It shall be appreciated by those skilled in the art having the benefit of this disclosure that there are various well known methods for achieving the balance of providing a polymerized gas mixture that performs both anisotropic trench etching and generates a polymerized film that is deposited on the sidewalls. Additionally, the inventors postulate that the polymerized gas mixture promotes polymerization on the fence, which prevents the fence from being removed. In operation, after the polymerized gas mixture is applied to the low-k dielectric, a portion of the trench is etched. However, the desired trench depth is not achieved with the application of the first gas mixture. Preferably, the plug remains in the via. A fence type formation surrounds the perimeter of the via. The method then proceeds to process block 262.

At block 262 the trench etch process is completed with a second gas mixture. The second gas mixture is a non-polymerized gas mixture that etches away the fence formation created after the application of the first gas mixture. The inventors postulate that a non-polymerized gas is needed to etch the fence because of the polymer deposited on the fence in process block 260. Preferably, the second gas mixture removes the plug residing within the via. By way of example and not of limitation, the non-polymerized gas mixture is either a gas mixture of $NF_3$, $N_2$, and a reducing gas $H_2$, or a gas mixture of $NF_3$, $N_2$, and an oxidizing gas $O_2$. Other gas mixtures that have little or no polymer precursors include $CF_4$ and $CHF_3$. Gas mixtures such as $CH_2F_2$ and $CH_3F$ are not recommended because they may produce the polymer film on the fence, however, the application of these gases may be controlled with an $O_2$ mixture. The method then proceeds to process block 264.

At block 264 the photoresist that was applied for the trench etch process is removed with a gas mixture that removes the photoresist. With the removal of the photoresist, the trench etch process for the low-k dielectric that has no intermediate etch stop layer is then completed. It shall be appreciated by those skilled in the art having the benefit of this disclosure that the method of the present invention may be applied to other dielectrics such as $SiO_2$ and for dielectrics having an intermediate etch-stop layer.

Figure 6A:
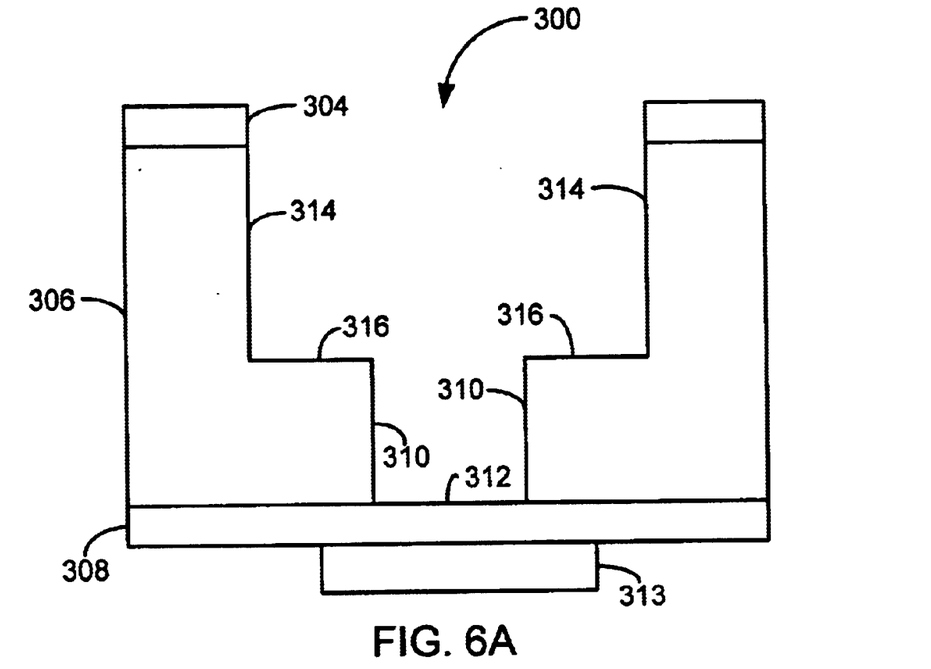
FIG. 6A and FIG. 6B shows a view of the resulting trench using the method of FIG. 5.
Figure 6B:
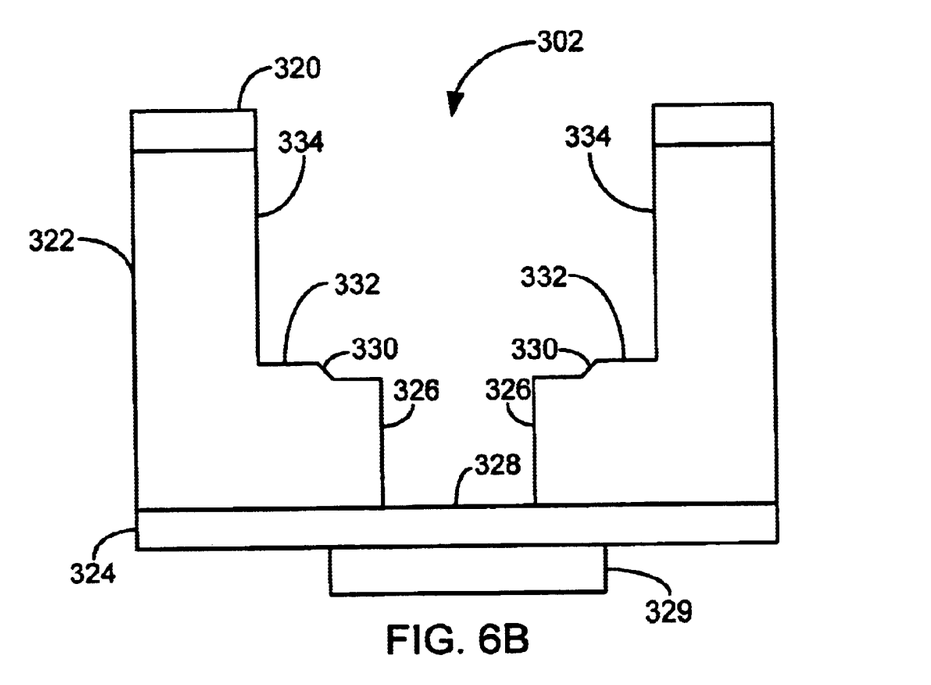

Referring to FIG. 6A and FIG. 6B there is shown an exploded view of the non-terraced interconnect structure 300 and terraced interconnect structure 302, respectively. Both of the interconnect structures 300 and 302 are generated using the method described above in FIG. 5.

FIG. 6A is an interconnect non-terraced structure 300 comprising a hardmask 304, a dielectric 306, and a barrier layer 308. Preferably, the dielectric 306 is a low-k dielectric that has no intermediate etch-stop layer. The interconnect structure 300 has a via component defined by a via sidewall 310 and via bottom 312. In one embodiment, a metallized object 313 is beneath the via bottom 312. The interconnect structure 300 also has a trench component defined by a trench sidewall 314 and a trench bottom 316. A visual inspection of the interconnect structure 300 reveals that the trench sidewall 314 is substantially orthogonal to the trench bottom 316. Additionally, the trench bottom 316 is substantially orthogonal to the via sidewall 310. Finally, the via sidewall 310 is substantially orthogonal to the via bottom 312.

FIG. 6B is an interconnect terraced structure 302 comprising a hardmask 320, a dielectric 322, and a barrier layer 324. Preferably, the dielectric 322 is a low-k dielectric that has no intermediate etch stop layer. The structure 302 has a via component defined by a via sidewall 326 and via bottom 328. In one embodiment, a metallized object 329 is beneath the via bottom 328. The via sidewall 326 interfaces with a terrace 330 configured above the via sidewall 326. The terrace 330 also interfaces with a trench bottom 332. The trench is also defined by a trench sidewall 334. The trench sidewall 334 is substantially orthogonal to the trench bottom 332. Additionally, the trench bottom 332 is substantially orthogonal to the via sidewall 326. Additionally, the via sidewall 326 is substantially orthogonal to the via bottom 328. Finally, the terrace 330 interfaces with the trench bottom 332 and the via sidewall 326 without detracting from the substantially orthogonal nature of the trench bottom 332 and the via sidewall 326.

An illustrative example showing the application of the etching a trench without a fence or facet is shown in FIG. 7A through FIG. 7G. In general, the illustrative set of figures depict a via first etch sequence that uses a plug to generate a fence with a first gas mixture. The fence is then etched away with a second gas mixture. Preferably, the illustrative example is adapted to a low-k dielectric that does not have an intermediate etch stop layer.

Figure 7A:
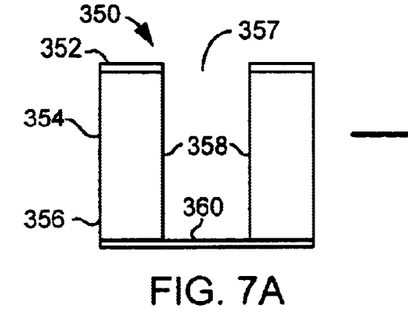
FIG. 7A through FIG. 7G provides an illustrative example that includes the application of the method described in FIG. 5.
Figure 7B:
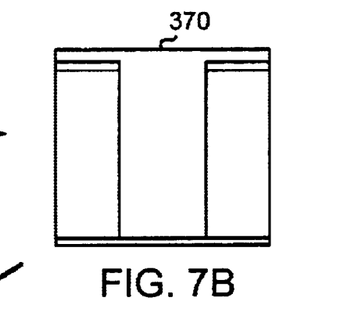
Figure 7C:
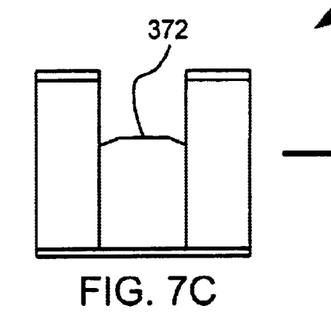
Figure 7D:
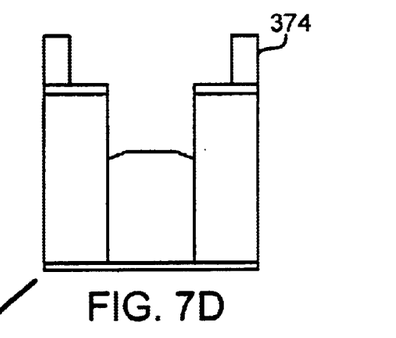

Referring more particularly to FIG. 7A, there is shown an illustrative wafer stack 350 that includes a hardmask layer 352, a dielectric layer 354, and a barrier layer 356. By way of example and not of limitation, the hardmask layer 352 may include SiON, SiN, SiC, and $SiO_2$; the dielectric layer 354 may include organosilicate glass (OSG); and the barrier layer may include $Si_3N_4$ and SiC. A via 357 has already been etched into the wafer stack 350. The via 357 is defined by two sidewalls 358 and a bottom 360. Referring to FIG. 7B, there is shown the application of an organic layer 370 using the well-known planarized organic spin-on technique. The organic layer is then etched back to an organic plug 372 as shown in FIG. 7C. The organic plug 372 is relatively a "tall" plug having a height that is equal to the desired trench height or exceeds the desired trench height. A photoresist layer 374 is applied as shown in FIG. 7D. It shall be appreciated by those skilled in the art having the benefit of this disclosure that a bottom anti-reflecting coating (not shown) is also used to prevent the reflection of light that is transmitted through the photoresist. The methods shown in FIG. 7A through 7D have previously been described above.

Figure 7E:
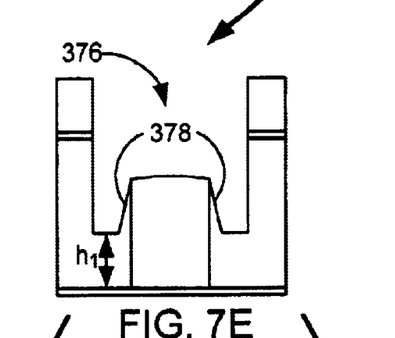

After the photoresist layer 374 is applied, then first gas mixture is used during the trench etch process. Preferably, the first gas mixture is a polymerized gas mixture as described above. However, the polymerized gas mixture generates a fence. The resulting structure 376 is shown in FIG. 7E. FIG. 7E shows a structure having a fence 378 surrounding the plug. The trench generated with the first gas mixture has a first height, $h_1$.

Figure 7F:
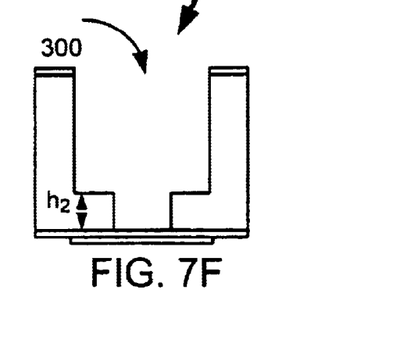
Figure 7G:
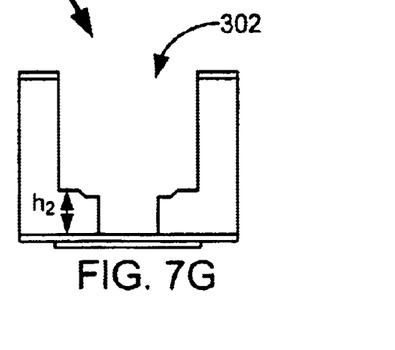

After the first gas mixture is applied during the trench etch process, a second gas mixture is applied. The second gas mixture is a non-polymerized gas mixture as described above. Preferably, the non-polymerized gas mixture etches the fence, a portion of the dielectric material, the organic plug and the photoresist. The non-polymerized gas mixture generates either a non-terraced trench structure 300 or a terraced trench structure 302 described in FIG. 6a and FIG. 6b, respectively. The second gas mixture etches away the fence 378 and the dielectric 354 to a second height, h2. The second height, h2, is the desired depth of the trench. The second gas mixture also etches away the plug. Depending on the material properties of the dielectric and the gas mixture either the non-terraced trench structure 300 is formed or the terraced trench structure 302 is formed. The non-terraced trench structure 300 is shown in FIG. 7F and the terraced trench structure 302 is shown in FIG. 7G.

Although the description above contains many specifications, these should not be construed as limiting the scope of the invention but as merely providing illustrations of some of the presently preferred embodiments of this invention. Thus, the scope of the invention should be determined by the appended claims and their legal equivalents rather than by the illustrative examples given.

What is claimed is:

1. A method of trench formation within a dielectric layer, comprising:

first, etching a via within said dielectric layer, said via having a first depth;

second, depositing an organic plug layer within said via;

third, etching a trench with a first gas mixture to a second depth, said second depth being less than said first depth; and fourth, further etching said trench with a second gas mixture to a third depth, said third depth being greater than said second depth and less than said first depth.

2. The method of claim 1 further comprising providing an intermediate layer between said via and said trench, said intermediate layer being at said third depth.

3. The method of claim 1 wherein said dielectric layer has a metallized object beneath the dielectric layer separated by a barrier layer, the method including an additional etching step of etching through said barrier layer to the metallized object.

4. The method of claim 1 applied to the formation of a via-first dual damascene structure on a wafer further comprising, depositing a hardmask on said dielectric prior to etching a via within said dielectric layer that identifies the location of said via with said hardmask.

5. The method of claim 1 wherein said dielectric layer is a low-k material having a k value of less than 3.0.

6. The method of claim 5 wherein said dielectric layer is an organosilicate glass dielectric.

7. The method of claim 1 wherein said first gas mixture is a polymerized gas mixture.

8. The method of claim 7 wherein said polymerized gas mixture includes a fluoro-carbon gas.

9. The method of claim 7 wherein said polymerized gas mixture includes a hydro-fluoro-carbon gas.

10. The method of claim 7 wherein said second gas mixture is a non-polymerized gas mixture.

11. The method of claim 10 wherein said non-polymerized gas mixture includes $NF_3$.

12. The method of claim 10 wherein said non-polymerized gas mixture include $CF_4$.

13. A method of trench formation within a low-k dielectric layer without an intermediate etch-stop layer, comprising:

first, etching a via within said dielectric layer, said via having a first depth;

second, etching a trench with a first gas mixture to a second depth, said second depth being less than said first depth; and third, etching said trench with a second gas mixture to a third depth, said third depth being greater than said second depth and less than said first depth.

14. The method of claim 13 wherein said first gas mixture is a polymerized gas mixture.

15. The method of claim 14 wherein said second gas mixture is a non-polymerized gas mixture.

16. The method of claim 15 wherein said low-k dielectric layer has a k value of less than 3.0.

17. The method of claim 15 wherein said low-k dielectric layer is an organosilicate glass dielectric.

18. The method of claim 15 wherein said low-k dielectric layer has a metallized object beneath said low-k dielectric layer separated by a barrier layer, the method including an additional etching step of etching through said barrier layer to said metallized object.

19. The method of claim 15 applied to the formation of a via-first dual damascene structure on a wafer further comprising, depositing a hardmask on said low-k dielectric prior to etching a via within said low-k dielectric layer that identifies the location of the said via with said hardmask.

* * * * *